(12) United States Patent
Krohn

(10) Patent No.: US 6,897,248 B2
(45) Date of Patent: *May 24, 2005

(54) UV CURABLE FERROMAGNETIC COMPOSITIONS

(75) Inventor: Roy C. Krohn, Fort Gratiot, MI (US)

(73) Assignee: Allied PhotoChemical, Inc., Kimball, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 10/785,680

(22) Filed: Feb. 24, 2004

(65) Prior Publication Data

US 2004/0167242 A1 Aug. 26, 2004

Related U.S. Application Data

(63) Continuation of application No. 10/193,408, filed on Jul. 11, 2002, now Pat. No. 6,716,893, which is a continuation-in-part of application No. PCT/US01/00978, filed on Jan. 11, 2001.
(60) Provisional application No. 60/175,973, filed on Jan. 13, 2000.

(51) Int. Cl.$^7$ .................................................. C08F 2/46
(52) U.S. Cl. .................. 522/92; 522/90; 522/96; 522/81; 522/83; 522/8; 522/11; 522/12; 522/33; 522/36; 522/31; 522/21; 522/64; 522/40; 522/42; 522/44; 522/46; 522/48; 522/100; 522/102; 522/103; 522/181; 522/182; 427/508; 427/496; 427/517; 427/502; 252/62.58; 252/62.54; 252/62.64
(58) Field of Search ........................ 522/8, 11, 12, 522/21, 33, 36, 31, 64, 40, 42, 44, 46, 48, 81, 83, 90, 92, 96, 100, 102, 103, 181, 182; 427/508, 517, 496, 502; 252/62.54, 62.56, 62.6

(56) References Cited

U.S. PATENT DOCUMENTS

| | | |
|---|---|---|
| 3,700,754 A | 10/1972 | Schmitt et al. |
| 3,953,643 A | 4/1976 | Cheung et al. |
| 3,968,056 A | 7/1976 | Bolon et al. |
| 3,988,647 A | 10/1976 | Bolon et al. |
| 4,049,844 A | 9/1977 | Bolon et al. |
| 4,088,801 A | 5/1978 | Bolon et al. |
| 4,113,894 A | 9/1978 | Koch, II |
| 4,187,340 A | 2/1980 | Oishi et al. |
| 4,188,449 A | 2/1980 | Lu et al. |
| RE30,274 E | 5/1980 | Bolon et al. |
| 4,256,591 A | 3/1981 | Yamamoto et al. |
| 4,271,212 A | 6/1981 | Stengle |
| 4,338,376 A | 7/1982 | Kritzler |
| 4,391,858 A | 7/1983 | Batzill |
| RE31,411 E | 10/1983 | Bolon et al. |
| 4,420,500 A | 12/1983 | Nakatani et al. |
| 4,439,494 A | 3/1984 | Olson |
| 4,455,205 A | 6/1984 | Olson et al. |
| 4,478,876 A | 10/1984 | Chung |
| 4,479,860 A | 10/1984 | Hayase et al. |
| 4,495,042 A | 1/1985 | Hayase et al. |
| 4,496,475 A | 1/1985 | Abrams |
| 4,513,023 A | 4/1985 | Wary |
| 4,533,445 A | 8/1985 | Orio |
| 4,539,258 A | 9/1985 | Panush |
| 4,547,410 A | 10/1985 | Panush et al. |
| 4,551,361 A | 11/1985 | Burzynski et al. |
| 4,557,975 A | 12/1985 | Moore |
| 4,594,315 A | 6/1986 | Shibue et al. |
| 4,609,612 A | 9/1986 | Berner et al. |
| 4,640,981 A | 2/1987 | Dery et al. |
| 4,665,342 A | 5/1987 | Topp et al. |
| 4,666,821 A | 5/1987 | Hein et al. |
| 4,684,353 A | 8/1987 | deSouza |
| 4,738,899 A | 4/1988 | Bluestein et al. |
| 4,788,108 A | 11/1988 | Saunders, Jr. et al. |
| 4,806,257 A | 2/1989 | Clark et al. |
| 4,814,208 A | 3/1989 | Miyazaki et al. |
| 4,816,717 A | 3/1989 | Harper et al. |
| 4,822,646 A | 4/1989 | Clark et al. |
| 4,828,758 A | 5/1989 | Gillberg-Laforce et al. |
| 4,877,512 A | 10/1989 | Bowns et al. |
| 4,900,763 A | 2/1990 | Kraushaar |
| 4,911,796 A | 3/1990 | Reed |
| 4,959,178 A | 9/1990 | Frentzel et al. |
| 4,960,614 A | 10/1990 | Durand |
| 4,964,948 A | 10/1990 | Reed |

(Continued)

FOREIGN PATENT DOCUMENTS

| | | |
|---|---|---|
| DE | 198 35 917 A1 | 2/2000 |
| EP | 0 081 323 A1 | 6/1983 |
| EP | 0 530 141 A1 | 3/1993 |
| EP | 0 567 940 A1 | 11/1993 |
| EP | 0 711 801 A2 | 5/1996 |
| EP | 0 820 217 A1 | 1/1998 |
| GB | 1 550 382 | 8/1979 |
| JP | 61203108 A | 9/1986 |
| JP | 4267097 A | 9/1992 |
| JP | 5279436 A | 10/1993 |
| JP | 5311103 A | 11/1993 |
| JP | 6016721 A | 1/1994 |
| WO | WO 97/31051 | 8/1997 |
| WO | WO 97/45458 | 12/1997 |
| WO | WO 98/47954 | 10/1998 |
| WO | WO 98/50317 | 11/1998 |
| WO | WO 00/62586 | 10/2000 |

Primary Examiner—James J. Seidleck
Assistant Examiner—Sanza L. McClendon
(74) Attorney, Agent, or Firm—Brooks Kushman P.C.

(57) ABSTRACT

The present invention discloses an ultraviolet light curable ferromagnetic composition and method for making such a composition that may be used to produce a ferromagnetic coating on a suitable substrate. These coatings may be used to produce printed capacitors and inductors. The disclosed composition does not contain any significant amount of volatile organic solvents that do not become incorporated in the active layer after curing.

19 Claims, No Drawings

U.S. PATENT DOCUMENTS

| | | |
|---|---|---|
| 4,975,471 A | 12/1990 | Hayase et al. |
| 5,006,397 A | 4/1991 | Durand |
| 5,049,480 A | 9/1991 | Nebe et al. |
| 5,068,714 A | 11/1991 | Seipler |
| 5,076,963 A | 12/1991 | Kameyama et al. |
| 5,100,848 A | 3/1992 | Enomoto et al. |
| 5,104,929 A | 4/1992 | Bilkadi |
| 5,116,639 A | 5/1992 | Kolk et al. |
| 5,128,387 A | 7/1992 | Shustack |
| 5,128,391 A | 7/1992 | Shustack |
| 5,149,971 A | 9/1992 | McElhaney et al. |
| 5,180,523 A | 1/1993 | Durand et al. |
| 5,180,757 A | 1/1993 | Lucey |
| 5,183,831 A | 2/1993 | Bielat et al. |
| 5,221,560 A | 6/1993 | Perkins et al. |
| 5,225,170 A | 7/1993 | Kolk et al. |
| 5,282,985 A | 2/1994 | Zabinski et al. |
| 5,296,295 A | 3/1994 | Perkins et al. |
| 5,326,636 A | 7/1994 | Durand et al. |
| 5,356,545 A | 10/1994 | Wayte |
| 5,384,160 A | 1/1995 | Frazzitta |
| 5,395,876 A | 3/1995 | Frentzel et al. |
| 5,424,182 A | 6/1995 | Marginean, Sr. et al. |
| 5,453,451 A | 9/1995 | Sokol |
| 5,454,892 A | 10/1995 | Kardon et al. |
| 5,462,701 A | 10/1995 | Hagemeyer et al. |
| 5,470,643 A | 11/1995 | Dorfman |
| 5,470,897 A | 11/1995 | Meixner et al. |
| 5,514,214 A | 5/1996 | Joel et al. |
| 5,523,143 A | 6/1996 | Hagemeyer et al. |
| 5,556,527 A | 9/1996 | Igarashi et al. |
| 5,561,730 A | 10/1996 | Lochkovic et al. |
| 5,565,126 A | 10/1996 | Kimura et al. |
| 5,587,433 A | 12/1996 | Boeckeler |
| 5,596,024 A | 1/1997 | Horie et al. |
| 5,609,918 A | 3/1997 | Yamaguchi et al. |
| 5,624,486 A | 4/1997 | Schmid et al. |
| 5,633,037 A | 5/1997 | Mayer |
| 5,686,792 A | 11/1997 | Ensign, Jr. |
| 5,698,310 A | 12/1997 | Nakamura et al. |
| 5,716,551 A | 2/1998 | Unruh et al. |
| 5,718,950 A | 2/1998 | Komatsu et al. |
| 5,747,115 A | 5/1998 | Howell et al. |
| 5,750,186 A | 5/1998 | Frazzitta |
| 5,773,487 A | 6/1998 | Sokol |
| 5,784,197 A | 7/1998 | Frey et al. |
| 5,787,218 A | 7/1998 | Ohtaka et al. |
| 5,837,745 A | 11/1998 | Safta et al. |
| 5,866,628 A | 2/1999 | Likavec et al. |
| 5,871,827 A | 2/1999 | Jaffe et al. |
| 5,883,148 A | 3/1999 | Lewandowski et al. |
| 5,888,119 A | 3/1999 | Christianson et al. |
| 5,914,162 A | 6/1999 | Bilkadi |
| 5,942,284 A | 8/1999 | Hiskes et al. |
| 5,945,502 A | 8/1999 | Hsieh et al. |
| 5,950,808 A | 9/1999 | Tanabe et al. |
| 5,968,996 A | 10/1999 | Sanchez et al. |
| 5,994,424 A | 11/1999 | Safta et al. |
| 6,054,501 A | 4/2000 | Taniguchi et al. |
| 6,165,386 A | 12/2000 | Endo et al. |
| 6,211,262 B1 | 4/2001 | Mejiritski et al. |
| 6,261,645 B1 | 7/2001 | Betz et al. |
| 6,267,645 B1 | 7/2001 | Burga et al. |
| 6,290,881 B1 | 9/2001 | Krohn |

UV CURABLE FERROMAGNETIC COMPOSITIONS

CROSS-REFERENCE TO RELATED APPLICATION

This application is a continuation of U.S. patent application Ser. No. 10/193,408, filed Jul. 11, 2002, now U.S. Pat. No. 6,716,893 which, in turn, is a continuation-in-part of International Application Serial No. PCT/US01/00978, filed Jan. 11, 2001 which, in turn, claims the benefit of U.S. provisional patent application Ser. No. 60/175,973, filed Jan. 13, 2000.

TECHNICAL FIELD

The present invention relates to ultraviolet light (uv) curable compositions capable of producing a ferromagnetic coating.

BACKGROUND OF THE INVENTION

Electronic components, such as capacitors and inductors, are typically applied to rigid circuit boards through the process of soldering. Electronic components may be produced applying curable compositions to a suitable substrate. Such film coatings have previously been formed through thermosetting and heat curing processes. Ferromagnetic materials are materials which can be permanently magnetized upon application of an external magnetic field. Ferromagnetic coatings in particular, as useful for forming such electronic components as inductors and capacitors.

Heat curable coatings require the use of organic solvents that contain a significant amount of volatile organic compounds (VOCs). These VOCs escape into the atmosphere while the heat curable coating dries. Such solvent based systems are undesirable because of the hazards and expenses associated with VOCs. The hazards include water and air pollution and the expenses include the cost of complying with strict government regulation on solvent emission levels. In contrast, UV curable ferromagnetic film coatings contain reactive monomers instead of solvents; thus eliminating the detrimental effects of the VOCs.

UV curable coatings are cured through rapid photo-induced polymerizations instead of thermal energy which releases VOCs into the atmosphere. Since the UV curing process is essentially solvent free, the necessity for time consuming and expensive pollution abatement procedures is greatly reduced.

UV curable coatings offer several other benefits not associated with thermally cured coatings. First, faster cure times offer substantial economic benefits. Furthermore, heat sensitive materials can be safely coated and cured with UV light without thermal degradation of heat sensitive substrates. Additionally, UV light is a relatively low cost of energy due to its widespread availability.

Although UV curable coatings are superior to their thermal counterparts, there are still disadvantages inherent in UV curable coatings. Since UV curable coatings require compositions with high molecular weight and viscosity, spray and brush application is often difficult. Additionally, many UV curable coatings require compositions that are prone to dispersion and instability.

Accordingly, there exists a need to provide environmentally safe UV curable ferromagnetic compositions which exhibit improved performance and workability. Additionally, there is a need to provide a method of applying an improved composition which furthers the goal of improved performance.

SUMMARY OF INVENTION

It is an object of the present invention to provide an improved composition that upon curing by ultraviolet light produces a ferromagnetic coating.

It is another object of the present invention to provide an improved ferromagnetic composition suitable for producing screen printed capacitors and inductors.

It is another object of the present invention to provide an improved ferromagnetic composition suitable for coating a suitable substrate that can be applied by spraying, screen printing, dipping, and brushing.

It is still another object of the present invention to provide an improved ferromagnetic composition that does not contain any significant amount of volatile organic solvents that do not become incorporated in the active layer after curing.

The present invention discloses an ultraviolet light curable ferromagnetic composition and method for making such a composition that may be used to produce a ferromagnetic coating on a suitable substrate. The disclosed composition does not contain-any significant amount of volatile organic solvents that do not become incorporated in the active layer after curing. Specifically, the ferromagnetic composition contains 5% or less volatile organic solvents by weight.

In accordance with one aspect of the invention, an ultraviolet light curable ferromagnetic composition is provided. The ferromagnetic composition comprises a mixture of one or more aliphatic acrylated oligomers, a magnetic powder, and a photoinitiator. Preferably, the aliphatic acrylated oligomer mixture is present in an amount of about 15% to 45% of the total weight of the ferromagnetic composition, the photoinitiator is present in an amount of about 1% to 10% of the total weight of the ferromagnetic composition, and the magnetic powder is present in an amount of 20% to 60% of the total weight of the ferromagnetic composition. All percentages of the ferromagnetic composition as expressed in this document refer to the weight percentage of the stated component to the total weight of the ferromagnetic composition in its fluid state at standard temperature and pressure.

The ferromagnetic composition preferably further comprises an acrylated epoxy oligomer preferably present in an amount of about 2% to 6% of the total weight of the ferromagnetic composition and an unsaturated monomer preferably present in an amount of about 15% to 25% of the total weight of the ferromagnetic composition. The ferromagnetic composition may optionally include a flow promoting agent preferably in an amount of about 0.1% to 6% of the ferromagnetic composition.

In accordance with yet another aspect of the invention, a method is provided for depositing a ferromagnetic coating on a substrate. The method comprises a first step of applying to the substrate a ferromagnetic fluid-phase composition ("ferromagnetic composition"). The ferromagnetic composition comprises a mixture of one or more aliphatic acrylated oligomers, a magnetic powder, and a photoinitiator. Preferably, the aliphatic acrylated oligomer mixture is present in an amount of about 15% to 45% of the total weight of the ferromagnetic composition, the photoinitiator is present in an amount of about 1% to 10% of the total weight of the ferromagnetic composition, and the magnetic powder is present in an amount of 20% to 60% of the total weight of the ferromagnetic composition. The ferromagnetic composition preferably also includes an acrylated epoxy oligomer preferably present in an amount of about 2% to 6% of the total weight of the ferromagnetic composition, an unsaturated monomer preferably present in an amount of about 15% to 25% of the total weight of the ferromagnetic composition, and a flow promoting agent in an amount of about 0.1% to 6% of the total weight of the ferromagnetic composition.

The method also includes a second step of illuminating the ferromagnetic composition on the substrate with an ultraviolet light to cause the ferromagnetic composition to cure into the ferromagnetic coating.

In accordance with this method, the ferromagnetic composition can be selectively deposited on the substrate at specific locations where ferromagnetic plating is desired. It need not be applied to the entire substrate.

BEST MODE FOR CARRYING OUT THE INVENTION

Ferromagnetic Compositions

Reference will now be made in detail to presently preferred compositions or embodiments and methods of the invention, which constitute the best modes of practicing the invention presently known to the inventor.

In accordance with one aspect of the invention, a presently preferred ultraviolet light curable ferromagnetic composition ("ferromagnetic composition") is provided. In this preferred embodiment, the ferromagnetic composition includes a mixture of one or more aliphatic acrylated oligomers. The aliphatic acrylated oligomer mixture is present in an amount of about 15% to 45% of the total weight of the ferromagnetic composition. The aliphatic acrylated oligomer mixture is more preferably present in an amount of about 25% to 35% of the total weight of the ferromagnetic composition, and most preferably about 30% of the total weight of the ferromagnetic composition. The aliphatic acrylated oligomer preferably comprises one or more urethane oligomers. Suitable aliphatic acrylated oligomers include Radcure Ebecryl 244 (aliphatic urethane diacrylate diluted 10% by weight with 1,6-hexanediol diacrylate), Ebecryl 264 (aliphatic urethane triacrylate diluted 15% by weight with 1,6-hexanediol diacrylate), Ebecryl 284 (aliphatic urethane diacrylate diluted 12% by weight with 1,6-hexanediol diacrylate) urethanes, commercially available from Radcure UCB Corp. of Smyrna, Ga.; Sartomer CN-961E75 (aliphatic urethane diacrylate blended with 25% by weight ethoxylated trimethylol propane triacylate), CN-961H81 (aliphatic urethane diacrylate blended with 19% by weight 2(2-ethoxyethoxy)ethyl acrylate), CN-963A80 (aliphatic urethane diacrylate blended with 20% by weight tripropylene glycol diacrylate), CN-964 (aliphatic urethane diacrylate), CN-966A80 (aliphatic urethane diacrylate blended with 20% by weight tripropylene glycol diacrylate), CN-982A75 (aliphatic urethane diacrylate blended with 25% by weight tripropylene glycol diacrylate) and CN-983 (aliphatic urethane diacrylate), commercially available from Sartomer Corp. of Exton, Pa.; TAB FAIRAD 8010, 8179, 8205, 8210, 8216, 8264, M-E-15, UVU-316, commercially available from TAB Chemicals of Chicago, Ill.; and Echo Resin ALU-303, commercially available from Echo Resins of Versaille, Mo.; and Genomer 4652, commercially available from Rahn Radiation Curing of Aurora, Ill. The preferred aliphatic acrylated oligomers include Ebecryl 264 and Ebecryl 284. Ebecryl 264 is an aliphatic urethane triacrylate of 1200 molecular weight supplied as an 85% solution in hexanediol diacrylate. Ebecryl 284 is aliphatic urethane diacrylate of 1200 molecular weight diluted 10% with 1,6-hexanediol diacrylate. Combinations of these materials may also be employed herein.

The preferred ferromagnetic composition still further includes a magnetic powder preferably in an amount of about 20% to 60% of the total weight of the ferromagnetic composition. In one embodiment of the present invention, the magnetic powder will also possess high electrical conductivity Such powders, include, but are not limited to magnetized steel or iron ground into a powder. In a more preferred embodiment, the magnetic powder is a ferrite. In this particularly preferred embodiment, the magnetic powder will have a high resistivity. Because of the presence of at least some electrical conductivity (whether low or high resistivity) the magnetic powder is sometimes referred to as a conductive/magnetic powder. The magnetic powder is more preferably present in an amount of about 30% to 50% of the total weight of the ferromagnetic composition, and most preferably about 40% of the total weight of the ferromagnetic composition. The preferred magnetic powder is Ferrite powder commercially available from GFS Chemical located in Powell, Ohio. Ferrites are magnetic substances that consist essentially of ferric oxide combined with the oxides of one or more metals (as iron, manganese, nickel, or zinc). Ferrites are described by $MOFe_2O_3$ where $Fe_2O_3$ is iron oxide and MO refers to a divalent metal (i.e, iron, zinc, nickel, manganese and copper) oxide.

The preferred ferromagnetic composition also includes a photoinitiator in an amount of about 1% to 10% of the total weight of the ferromagnetic composition of the ferromagnetic composition. The photomitiator is more preferably present in an amount of about 2% to 6% of the total weight of the ferromagnetic composition, and most preferably about 4.5% of the total weight of the ferromagnetic composition. Suitable photoinitiators include Irgacure 184 (1-hydroxycyclohexyl phenyl ketone), Irgacure 907 (2-methyl-1-[4-(methylthio)phenyl]-2-morpholino propan-1-one), Irgacure 369 (2-benzyl-2-N,N-dimethylamino-1-(4-morpholinophenyl)-1butanone), Irgacure 500 (the combination of 50% by weight 1-hydroxy cyclohexyl phenyl ketone and 50% by weight benzophenone), Irgacure 651 (2,2-dimethoxy-2-phenyl acetophenone), Irgacure 1700 (the combination of 25% by weight bis(2,6-dimethoxybenzoyl-2,4-,4-trimethyl pentyl) phosphine oxide, and 75% by weight 2-hydroxy-2-methyl-1-phenyl-propan-1-one), Darocur 1173 (2-hydroxy-2-methyl-1-phenyl-1-propanone) and Darocur 4265 (the combination of 50% by weight 2,4,6-trimethylbenzoyldiphenyl-phosphine oxide, and 50% by weight 2-hydroxy 2-methyl-1-phenyl-propan-1-one), available commercially from Ciba-Geigy Corp., Tarrytown, N.Y.; CYRACURE UVI-6974 (mixed triaryl sulfonium hexafluoroantimonate salts) and CYRACURE UVI-6990 (mixed triaryl sulfonium hexafluorophosphate salts) available commercially from Union Carbide Chemicals and Plastics Co. Inc., Danbury, Conn.; and Genocure CQ, Genocure BOK, and Genocure M.F., commercially available from Rahn Radiation Curing. The preferred photoinitiator is Irgacure 1700 commercially available from Ciba-Geigy of Tarrytown, N.Y. Combinations of these materials may also be employed herein.

This preferred ferromagnetic composition further includes an acrylated epoxy oligomer. The acrylated epoxy oligomer is present in an amount of about 2% to 6% of the total weight of the ferromagnetic composition. The acrylated epoxy oligomer is more preferably present in an amount of about 3% to 5% of the total weight of the ferromagnetic composition, and most preferably about 4% of the total weight of the ferromagnetic composition. Suitable acrylated epoxy oligomers include Radcure Ebecryl 3603 (novolac epoxy acrylate diluted 20% by weight with tripropylene glycol diacrylate), commercially available from Radcure UCB Corp.; Sartomer CN-120 (difunctional bisphenol based epoxy acrylate) and CN-124 (difunctional bisphenol based epoxy acrylate), commercially available from Sartomer Corp.; and Echo Resin TME 9310 and 9345, commercially available from Echo Resins. The preferred acrylated epoxy oligomer is Ebecryl 3603, which is a tri-functional acrylated epoxy novolac. Combinations of these materials may also be employed herein.

The ferromagnetic composition preferably includes an ethylenically unsaturated monomer having Formula I:

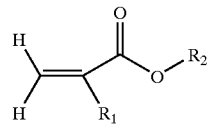

wherein $R_1$ is hydrogen or substituted or unsubstituted alkyl; and $R_2$ is substituted or unsubstituted alkyl having more than 4 carbon atoms, cycloalkyl, cycloalkenyl, or substituted or unsubstituted aryl. Preferably $R_1$ is hydrogen or methyl; and $R_2$ is isobornyl, phenyl, benzyl, dicylcopentenyl, diclypentenyl oxyethyl, cyclohexyl, and naphthyl. The most preferred ethyleneically unsaturated monomers are isobornyl acrylate monomers. The isobornyl acrylate monomers are preferably present in an amount of about 15% to 25% of the total weight of the ferromagnetic composition. The isobornyl acrylate monomer is more preferably present in an amount of about 18% to 22% of the total weight of the ferromagnetic composition, and most preferably about 20% of the total weight of the ferromagnetic composition. Suitable isobornyl acrylate monomers include Sartomer SR-423 (isobornyl methacrylate):

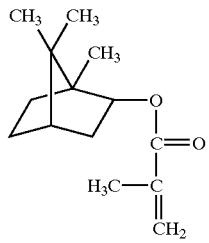

and SR-506 (isobornyl acrylate):

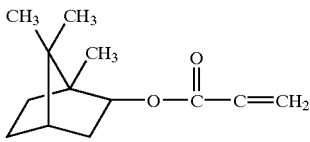

available from Sartomer Corp.; Radcure IBOA (isobornyl acrylate), commercially available from Radcure Corp.; IBOA and IBOMA, commercially available from CPS Chemical of Bradford, England; and Genomer 1121, commercially available from Rahn Radiation Curing. The preferred isobornyl acrylate monomer is Radcure IBOA, commercially available from Radcure Corp. Radcure IBOA is a high purity, low color monomer. Combinations of these materials may also be employed herein.

The preferred ferromagnetic composition still further includes a flow promoting agent in an amount of about 0.1% to 6% of the total weight of the ferromagnetic composition, and preferably about 3% of the total weight of the ferromagnetic composition, of the paint composition. Suitable flow promoting agents include Genorad 17, commercially available from Rahn Radiation Curing; and Modaflow, commercially available from Monsanto Chemical Co., St. Louis, Mo. The preferred flow promoting agent is Modaflow which is an ethyl acrylate and 2-ethylhexyl acrylate copolymer that improves the flow of the composition. Combinations of these materials may also be employed herein.

To illustrate, the following example sets forth a presently preferred ferromagnetic composition according to this aspect of the invention.

EXAMPLE 1

This example provides a preferred ferromagnetic composition according to the invention that may be applied to a substrate by screen printing. The ferromagnetic composition was made from the following components:

| Component | Approximate Weight % |
|---|---|
| Ebecryl 264 | 15.1 |
| Ebecryl 284 | 15.1 |
| IBOA | 19.9 |
| Irgacure 1700 | 4.5 |
| Ebecryl 3603 | 4.0 |
| Modaflow | 2.9 |
| Ferrite | 38.5 |
| Total | 100.00 |

In this example the IBOA and Irgacure 1700 are mixed in a pan with a propeller blade mixer for 30 seconds at a speed of 500 to 1000 rpm. In the next step, the Ebecryl 264, the Ebecryl 284, the Ebecryl 3603, and Modaflow are introduced into the pan and mixed for 1 to 2 minutes at a speed of 2000 rpm. In the final step, the Ferrite is added and mixed at 2000 rpm for 1 to 2 minutes. The mixing is temporarily suspended if the temperature exceed 100° F.

Method for Depositing a Ferromagnetic Coating

In accordance with still another aspect of the invention, a method is provided for depositing an ferromagnetic coating on a suitable substrate. The method comprises a first step of applying a ferromagnetic fluid-phase composition ("ferromagnetic composition") to the substrate.

The ferromagnetic composition comprises a mixture of one or more aliphatic acrylated oligomers, wherein the aliphatic acrylated oligomer is present in an amount of about 15% to 45% of the total weight of the ferromagnetic composition. The ferromagnetic composition also includes a magnetic powder in an amount of about 20% to 60% of the total weight of the ferromagnetic composition, and a photoinitiator in an amount of about 1% to 10% of the total weight of the ferromagnetic composition. The ferromagnetic composition preferably includes an acrylated epoxy oligomer in an amount of about 2% to 6% of the total weight of the ferromagnetic composition, an isobornyl acrylate monomer in an amount of about 15% to 25% of the total weight of the ferromagnetic composition, and a flow promoting agent in an amount of about 0.1% to 6% of the total weight of the ferromagnetic composition. The preferred ferromagnetic compositions according to this method are those described herein, for example, including the compositions described in example 1.

The ferromagnetic composition may be applied to the substrate using a number of different techniques. The ferromagnetic composition may be applied, for example, by direct brush application, or it may be sprayed onto the substrate surface. It also may be applied using a screen printing technique. In such screen printing technique, a "screen" as the term is used in the screen printing industry is used to regulate the flow of liquid composition onto the substrate surface. The ferromagnetic composition typically would be applied to the screen as the latter contacts the substrate. The ferromagnetic composition flows through the silk screen to the substrate, whereupon it adheres to the substrate at the desired film thickness. Screen printing techniques suitable for this purpose include known techniques, but wherein the process is adjusted in ways known to persons of ordinary skill in the art to accommodate the viscosity, flowability, and other properties of the liquid-phase composition, the substrate and its surface properties, etc. Flexographic techniques, for example, using pinch rollers to contact the ferromagnetic composition with a rolling substrate, also may be used.

The method includes a second step of illuminating the ferromagnetic fluid-phase composition on the substrate with an ultraviolet light to cause the ferromagnetic fluid-phase composition to cure into the ferromagnetic coating. This illumination may be carried out in any number of ways, provided the ultraviolet light or radiation impinges upon the ferromagnetic composition so that the ferromagnetic composition is caused to polymerize to form the coating, layer, film, etc., and thereby cures.

Curing preferably takes place by free radical polymerization, which is initiated by an ultraviolet radiation source. The photoinitiator preferably comprises a photoinitiator, as described above.

Various ultraviolet light sources may be used, depending on the application. Preferred ultraviolet radiation sources for a number of applications include known ultraviolet lighting equipment with energy intensity settings of, for example, 125 watts, 200 watts, and 300 watts per square inch.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A photocurable ferromagnetic composition comprising:
   an acrylated epoxy oligomer;
   an ethylenically unsaturated monomer having Formula I:

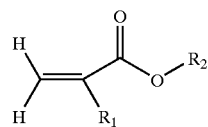

wherein $R_1$ is hydrogen or substituted or unsubstituted alkyl; and $R_2$ is substituted or unsubstituted alkyl having more than 4 carbon atoms, cycloalkyl, cycloalkenyl, or substituted or unsubstituted aryl;
   a photoinitiator; and
   a magnetic powder, wherein the photocurable ferromagnetic composition includes less than about 5 weight percent volatile organic compounds.

2. The photocurable ferromagnetic composition of claim 1 wherein R1 is hydrogen or methyl; and R2 is isoborynl, phenyl, benzyl, dicylcopentenyl, diclypentenyl oxyethyl, cyclohexyl, and naphthyl.

3. The photocurable ferromagnetic composition of claim 1 wherein the magnetic powder is ferrite.

4. The photocurable ferromagnetic composition of claim 1 wherein:
   the acrylated epoxy oligomer present in an amount from 2% to 6% of the weight of the ferromagnetic composition;
   the photoinitiator present in an amount from 1% to 10% of the weight of the ferromagnetic composition;
   the magnetic powder present in an amount from 20% to 60% of the weight of the ferromagnetic composition; and
   the balance is the ethylenically unsaturated monomer having Formula I.

5. The photocurable ferromagnetic composition of claim 1 further comprising an acrylated aliphatic oligomer mixture.

6. The photocurable ferromagnetic composition of claim 5 wherein the acrylated aliphatic oligomer mixture is present in an amount from 15% to 45% of the weight of the ferromagnetic composition.

7. The photocurable ferromagnetic composition of claim 5 further comprising a flow promoting agent.

8. The photocurable ferromagnetic composition of claim 7 wherein the flow promoting agent is present in an amount from 0.1% to 6% of the weight of the ferromagnetic composition.

9. The photocurable ferromagnetic composition of claim 7 wherein:
   the acrylated epoxy oligomer is present in an amount from 3% to 5% of the weight of the ferromagnetic composition;
   the photoinitiator is present in an amount from 2% to 6% of the weight of the ferromagnetic composition;
   the acrylated aliphatic oligomer mixture is present in an amount from 25% to 35% of the weight of the ferromagnetic composition;
   the flow promoting agent is present in an amount from 0.1% to 6% of the weight of the ferromagnetic composition;
   the magnetic powder is present in an amount from 30% to 50% of the weight of the ferromagnetic composition; and
   the balance is the ethylenically unsaturated monomer having Formula I.

10. The photocurable ferromagnetic composition of claim 7 wherein:
    the acrylated epoxy oligomer is present in an amount of 4% of the weight of the ferromagnetic composition;
    the photoinitiator is present in an amount of 4.5% of the weight of the ferromagnetic composition;
    the acrylated aliphatic oligomer mixture is present in an amount of 30% of the weight of the ferromagnetic composition;
    the flow promoting agent is present in an amount of 3% of the weight of the ferromagnetic composition;
    the magnetic powder is present in an amount of 40% of the weight of the ferromagnetic composition; and
    the balance is the ethylenically unsaturated monomer having Formula I.

11. The ferromagnetic composition of claim 1 wherein the photoinitiator is selected from the group consisting of:
    1-hydroxycyclohexyl phenyl ketone;
    2-methyl-1-[4-(methylthio)phenyl]-2-morpholino propan-1-;
    the combination of 50% 1-hydroxy cyclohexyl phenyl ketone and 50% benzophenone;

2,2-dimethoxy-1,2-diphenylethan-1-one;

the combination of 25% bis(2,6-dimethoxybenzoyl-2,4-, 4-trimethyl pentyl phosphine oxide and 75% 2-hydroxy-2-methyl-1-phenyl-propan-1-one;

2-hydroxy-2-methyl-1-phenyl-1-propane;

the combination of 50% 2,4,6-trimethylbenzoyldiphenylphosphine oxide and 50% 2-hydroxy 2-methyl-1-phenyl-propan-1-one;

mixed triaryl sulfonium hexafluoroantimonate salts, mixed triaryl sulfonium hexafluorophosphate salts; and mixtures thereof.

12. The ferromagnetic composition of claim 1 wherein the acrylated epoxy oligomer is selected from the group consisting of:

novolac epoxy acrylate diluted 20% by weight with tripropylene glycol diacrylate;

difunctional bisphenol based epoxy acrylate; and mixtures thereof.

13. A photocurable ferromagnetic composition comprising:

an acrylated epoxy oligomer present in an amount from 2% to 6% of the weight of the ferromagnetic composition;

an isobornyl acrylate monomer present in an amount from about 15% to 25% of the total weight of the ferromagnetic composition;

a photoinitiator present in an amount from 1% to 10% of the weight of the ferromagnetic composition; and a magnetic powder present in an amount from 20% to 60% of the weight of the ferromagnetic composition.

14. The photocurable ferromagnetic composition of claim 13 wherein the magnetic powder is ferrite.

15. The photocurable ferromagnetic composition of claim 13 further comprising an acrylated aliphatic oligomer mixture.

16. The photocurable ferromagnetic composition of claim 13 further comprising a flow promoting agent.

17. The ferromagnetic composition of claim 13 wherein the isobornyl acrylate monomer is selected from the group consisting of isobornyl acrylate, isobornyl methacrylate, and mixtures thereof.

18. The ferromagnetic composition of claim 13 wherein the photoinitiator is selected from the group consisting of:

1-hydroxycyclohexyl phenyl ketone;

2-methyl-1-[4-(methylthio)phenyl]-2-morpholino propan-1-;

the combination of 50% 1-hydroxy cyclohexyl phenyl ketone and 50% benzophenone;

2,2-dimethoxy-1,2-diphenylethan-1-one;

the combination of 25% bis(2,6-dimethoxybenzoyl-2,4-, 4-trimethyl pentyl phosphine oxide and 75% 2-hydroxy-2-methyl-1-phenyl-propan-1-one;

2-hydroxy-2-methyl-1-phenyl-1-propanone;

the combination of 50% 2,4,6-trimethylbenzoyldiphenylphosphine oxide and 50% 2-hydroxy 2-methyl-1-phenyl-propan-1-one;

mixed triaryl sulfonium hexafluoroantimonate salts, mixed triaryl sulfonium hexafluorophosphate salts; and mixtures thereof.

19. The ferromagnetic composition of claim 13 wherein the acrylated epoxy oligomer is selected from the group consisting of:

novolac epoxy acrylate diluted 20% by weight with tripropylene glycol diacrylate;

difunctional bisphenol based epoxy acrylate; and mixtures thereof.

* * * * *

UNITED STATES PATENT AND TRADEMARK OFFICE
CERTIFICATE OF CORRECTION

PATENT NO. : 6,897,248 B2  
DATED : May 24, 2005  
INVENTOR(S) : Roy C. Krohn

It is certified that error appears in the above-identified patent and that said Letters Patent is hereby corrected as shown below:

Column 10,
Line 12, delete "propan-1-" and insert therfor -- propan-1-one --.

Signed and Sealed this

Sixteenth Day of August, 2005

JON W. DUDAS
*Director of the United States Patent and Trademark Office*